United States Patent
Zhang et al.

(10) Patent No.: US 11,212,030 B2
(45) Date of Patent: Dec. 28, 2021

(54) HYBRID ARQ WITH VARYING MODULATION AND CODING

(71) Applicant: Marvell World Trade Ltd., St. Michael (BB)

(72) Inventors: Yan Zhang, Palo Alto, CA (US); Hongyuan Zhang, Fremont, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 132 days.

(21) Appl. No.: 16/683,278

(22) Filed: Nov. 14, 2019

(65) Prior Publication Data

US 2020/0162187 A1 May 21, 2020

Related U.S. Application Data

(60) Provisional application No. 62/770,082, filed on Nov. 20, 2018.

(51) Int. Cl.
*H04L 1/00* (2006.01)
*H04W 84/12* (2009.01)
(Continued)

(52) U.S. Cl.
CPC ....... *H04L 1/0003* (2013.01); *H03M 13/1111* (2013.01); *H04L 1/0061* (2013.01); *H04W 72/0453* (2013.01); *H04W 84/12* (2013.01)

(58) Field of Classification Search
CPC .............. H04W 72/0453; H04W 84/12; H04L 1/0061; H04L 1/0003
See application file for complete search history.

(56) References Cited

U.S. PATENT DOCUMENTS 9,876,614 B1  1/2018  Sun et al.
10,135,582 B1  11/2018  Sun et al.
(Continued)

FOREIGN PATENT DOCUMENTS

EP   1313249 A2   5/2003

OTHER PUBLICATIONS

European Application # 19209668.3 search report dated Apr. 17, 2020.

(Continued)

*Primary Examiner* — Angel T Brockman

(57) ABSTRACT

A method for receiving a WLAN data transmission includes receiving, at a first WLAN device from a remote WLAN device, a WLAN transmission including first bits that are modulated and encoded using a first MCS associated with a first modulation scheme and a first FEC coding rate. First soft-decoding metrics are computed for the first bits. A WLAN retransmission corresponding to the WLAN transmission is received. The WLAN retransmission includes second bits that are modulated and encoded using a second MCS associated with a second modulation scheme and a second FEC coding rate, the second MCS having better error performance than the first MCS. Second soft-decoding metrics are computed for the second bits. The first soft-decoding metrics and the second soft-decoding metrics are combined, to produce combined soft-decoding metrics. Data carried by the WLAN transmission is reconstructed by applying FEC decoding to the combined soft-decoding metrics.

8 Claims, 5 Drawing Sheets

(51) Int. Cl.
*H03M 13/11* (2006.01)
*H04W 72/04* (2009.01)

(56) References Cited

U.S. PATENT DOCUMENTS

2014/0192857 A1* 7/2014 Perets .................... H04L 69/04
375/240
2016/0119912 A1* 4/2016 Terry ..................... H04L 5/003
370/329
2016/0365952 A1 12/2016 Kim et al.

OTHER PUBLICATIONS 802.11 REVmd D2.1, "IEEE Draft Standard for Information Technology—Telecommunications and Information Exchange Between Systems; Local and Metropolitan Area Networks—Specific Requirements—Part 11: Wireless LAN Medium Access Control (MAC) and Physical Layer (PHY) Specifications", section 6.3.27, pp. 1-12, Feb. 2019.

IEEE Std 802.11ac, "IEEE Standard for Information technology—Telecommunications and information exchange between systems Local and metropolitan area networks—Specific requirements, Part 11: Wireless LAN Medium Access Control (MAC) and Physical Layer (PHY) Specifications Amendment 4: Enhancements for Very High Throughput for Operation in Bands below 6 GHz", pp. 1-424, year 2013.

IEEE Std 802.1AX, :IEEE Standard for Local and metropolitan area networks—Link Aggregation, pp. 1-163, Nov. 3, 2008.

\* cited by examiner

HYBRID ARQ WITH VARYING MODULATION AND CODING

CROSS-REFERENCE TO RELATED APPLICATIONS

This application claims the benefit of U.S. Provisional Patent Application 62/770,082, filed Nov. 20, 2018, whose disclosure is incorporated herein by reference.

FIELD OF THE DISCLOSURE

The present disclosure relates generally to Wireless Local-Area Networks (WLAN), and particularly to Hybrid Automatic Repeat Request (HARQ) in WLAN devices.

BACKGROUND

Various communication systems use Automatic Repeat Request (ARQ) schemes for data retransmission. ARQ and Block Acknowledgement (BA) mechanisms for Wireless Local-Area Networks (WLANs) are specified, for example, in IEEE Draft Standard 802.11 REVmd D2.1, entitled "IEEE Draft Standard for Information Technology—Telecommunications and Information Exchange Between Systems; Local and Metropolitan Area Networks—Specific Requirements—Part 11: Wireless LAN Medium Access Control (MAC) and Physical Layer (PHY) Specifications," February, 2019, e.g., in section 6.3.27.

U.S. Pat. No. 9,876,614 describes Hybrid ARQ (HARQ) schemes for WLAN. A method for transmission of media access control (MAC) protocol data units (MPDUs) over a WLAN communication channel is described. A first PHY data unit is generated at a first communication device and transmitted. The first PHY data unit has a data field that includes a first MPDU to be transmitted to a second communication device, and a PHY signal field that includes a transmission version field set to indicate an initial transmission of the first MPDU. In response to determining that a first acknowledgment has not been received, a second PHY data unit is generated at the first communication device and transmitted. The second PHY data unit has a data field that includes the first MPDU, and a PHY signal field that includes a transmission version field set to indicate a retransmission of the first MPDU.

The description above is presented as a general overview of related art in this field and should not be construed as an admission that any of the information it contains constitutes prior art against the present patent application.

SUMMARY

An embodiment that is described herein provides a method for receiving a Wireless Local-Area Network (WLAN) data transmission. The method includes receiving, at a first WLAN device from a remote WLAN device, a WLAN transmission including first bits that are modulated and encoded using a first Modulation and Coding Scheme (MCS) associated with a first modulation scheme and a first Forward Error Correction (FEC) coding rate. First soft-decoding metrics are computed for the first bits. A WLAN retransmission corresponding to the WLAN transmission is received from the remote WLAN device. The WLAN retransmission includes second bits that are modulated and encoded using a second MCS associated with a second modulation scheme and a second FEC coding rate, the second MCS having better error performance than the first MCS. Second soft-decoding metrics are computed for the second bits. The first soft-decoding metrics and the second soft-decoding metrics are combined, to produce combined soft-decoding metrics. Data carried by the WLAN transmission is reconstructed by applying FEC decoding to the combined soft-decoding metrics.

In some embodiments, the method further includes sending from the first WLAN device to the remote WLAN device an indication that the data carried by the WLAN transmission, having the first MCS, was not reconstructed successfully, and receiving the WLAN retransmission, having the second MCS, in response to the indication.

In some embodiments, receiving the second bits of the WLAN retransmission, having the second MCS, includes receiving (i) one or more second bits that do not have corresponding first bits in the WLAN transmission having the first MCS, and (ii) one or more second bits that have corresponding first bits in the WLAN transmission having the first MCS. In an embodiment, the method further includes buffering the first soft-decoding metrics in a memory buffer, while retaining in the memory buffer spaces for the soft-decoding metrics of the second bits that do not have corresponding first bits. In an embodiment, the method further includes, in combining the first soft-decoding metrics and the second soft-decoding metrics: For the second bits that have corresponding first bits, buffering the combined soft-decoding metrics in the memory buffer in place of the corresponding first soft-decoding metrics; and for the second bits that do not have corresponding first bits, buffering the second soft-decoding metrics in the spaces retained in the memory buffer.

In a disclosed embodiment, combining the first soft-decoding metrics and the second soft-decoding metrics includes assigning first weights to the first soft-decoding metrics, assigning second weights, higher than the first weights, to the second soft-decoding metrics, and combining the weighted first soft-decoding metrics and the weighted second soft-decoding metrics. In another embodiment, receiving the WLAN transmission including receiving a first bit on a first sub-carrier frequency, and receiving the WLAN retransmission includes receiving a second bit, corresponding to the first bit, on a second sub-carrier frequency that is different from the first sub-carrier frequency.

There is additionally provided, in accordance with an embodiment that is described herein, a Wireless Local-Area Network (WLAN) device including a receiver and a processor. The receiver is configured to receive, from a remote WLAN device, a WLAN transmission including first bits that are modulated and encoded using a first Modulation and Coding Scheme (MCS) associated with a first modulation scheme and a first Forward Error Correction (FEC) coding rate, and to subsequently receive, from the remote WLAN device, a WLAN retransmission corresponding to the WLAN transmission, the WLAN retransmission including second bits that are modulated and encoded using a second MCS associated with a second modulation scheme and a second FEC coding rate, the second MCS having better error performance than the first MCS. The processor is configured to compute first soft-decoding metrics for the first bits, to compute second soft-decoding metrics for the second bits, to combine the first soft-decoding metrics and the second soft-decoding metrics so as to produce combined soft-decoding metrics, and to reconstruct data carried by the WLAN transmission by applying FEC decoding to the combined soft-decoding metrics.

The present disclosure will be more fully understood from the following detailed description of the embodiments thereof, taken together with the drawings in which:

DETAILED DESCRIPTION OF EMBODIMENTS

Figure 1:
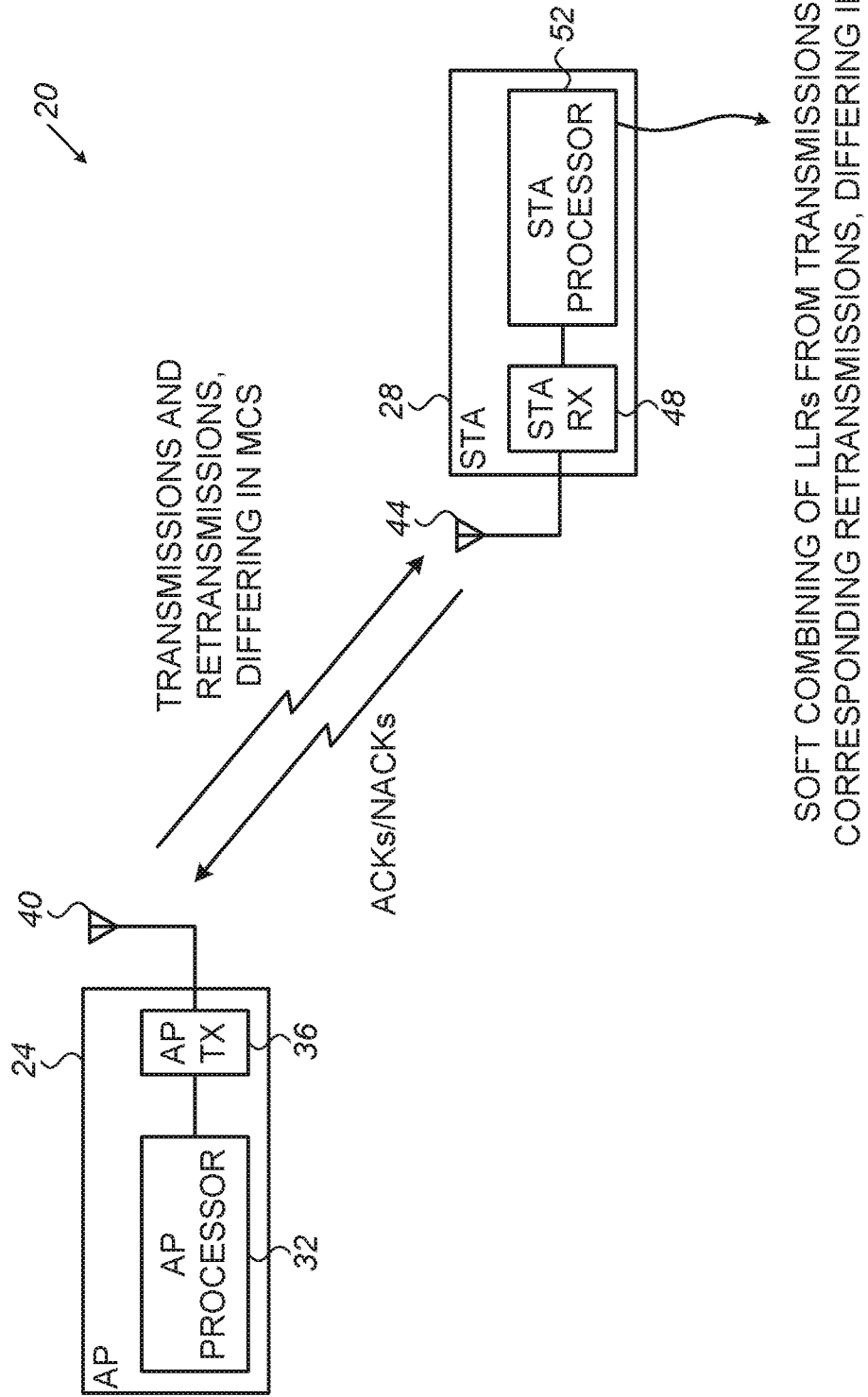
FIG. 1 is a block diagram that schematically illustrates a WLAN communication system, in accordance with an embodiment that is described herein.

Embodiments that are described herein provide Hybrid Automatic Repeat Request (HARQ) techniques for WLAN devices, such as Access Points (APs) and client stations (STAs). The disclosed techniques are applicable to the forward channel (AP to STA), to the reverse channel (STA to AP), as well as to sidelink channels (STA to STA) if used. As such, the description that follows refers to "a transmitter" (which may comprise a transmitter of an AP or of an STA) and to "a receiver" (which may comprise a receiver of an AP or of an STA).

In a typical HARQ scheme, in accordance with an embodiment, the transmitter transmits to the receiver a transmission (e.g., a packet or a frame). The term "packet" in this context refers generally to a data unit in the physical layer (PHY), whereas the term "frame" generally refers to a data unit in the Medium Access Control (MAC) layer. The receiver receives the transmission, computes soft-bits for the bits of the received data, and attempts to decode the FEC code based on the soft-bits. In the present context, the term "soft-bits" refers to non-binary metrics that are indicative not only of the data value (e.g., "0" or "1") but also of the confidence level or reliability of this data value. Soft-bits are also referred to herein as soft-decoding metrics. One example of soft-bits is Log-Likelihood Ratios (LLRs).

If FEC decoding fails, the receiver notifies the transmitter of the failure and the transmitter transmits a retransmission. The retransmission may simply repeat the transmission entirely, and/or the retransmission may comprise additional redundancy bits of the FEC that were not transmitted in the transmission. The receiver receives the retransmission, and computes soft-bits for the received bits of the retransmission.

For bits that are present both in the transmission and in the retransmission, the receiver combines the soft-bits of the retransmission with the corresponding soft-bits of the transmission. When the retransmission is a repeated copy of the transmission, the receiver combines each soft-bit of the retransmission with the soft-bits of the corresponding bit of the transmission (this scheme is sometimes referred to as Chase Combining—CC). When the retransmission also comprises additional redundancy bits, the receiver combines soft-bits of corresponding bits that appear both in the transmission and in the retransmission, whereas bits that appear only in the retransmission do not undergo combining (this scheme is sometimes referred to as Incremental Redundancy—IR).

The receiver then reattempts to decode the FEC based on the combined soft-bits. This process may be repeated, if needed, by requesting and receiving one or more additional retransmissions. By combining soft-bits in this manner, HARQ schemes achieve superior error performance, and thus enable enhanced throughput and capacity.

In generating a transmission (an original transmission or a retransmission) the transmitter typically encodes the data using a Forward Error Correction (FEC) code having a certain coding rate, and modulates the data using a certain modulation scheme. The combination of modulation scheme and coding rate is referred to as a Modulation and Coding Scheme (MCS). Non-limiting examples of modulation schemes are BPSK (one bit per symbol), QPSK (two bits per symbol), 8-QAM (three bits per symbol) and so on. The transmitter typically selects the MCS from a predefined set of MCSs that are supported by the transmitter and the receiver.

The MCSs in the set are typically ordered in descending order of error performance. Lower-order MCSs have better error performance than higher-order MCSs, i.e., better robustness to poor channel conditions such as poor Signal-to-Noise Ratio (SNR) or high interference. On the other hand, lower-order MCSs are less spectrally-efficient, i.e., consume more bandwidth than higher-order MCSs. To achieve better error performance, a lower-order MCS has a lower-order modulation scheme (fewer bits per symbol) and/or a lower coding rate (more redundancy) than a higher-order MCS. The description that follows will use terms such as "selecting a higher/lower MCS" with reference to the above-described ordering of MCSs.

When using HARQ, one possible solution would be for the transmitter to use the same MCS in the original transmission and in the subsequent retransmission. The inventors have found, however, that this solution performs poorly in many practical scenarios. Consider, for example, a scenario in which the MCS of the original transmission was selected using inaccurate or incorrect channel knowledge, or a scenario in which the channel changed considerably after the initial MCS selection. Such scenarios may occur, for example, when the transmitter or receiver is in motion or when the line-of-sight between the transmitter and receiver becomes obstructed.

In these scenarios, and in various others, a retransmission that uses the same MCS as the original transmission provides little or no performance gain. In other words, in many cases a retransmission has a high likelihood of failing, as well, if it were to use the same MCS as the original transmission. A high rate of failed retransmissions will sometimes even degrade the overall system performance, since the retransmissions incur bandwidth overhead.

Embodiments that are described herein provide improved HARQ techniques, in which the transmitter generates a retransmission using a lower (more robust) MCS than the MCS used in the corresponding original transmission. The MCS of the retransmission may have a lower-order modulation scheme and/or a lower coding rate than the MCS of the original transmission.

In the disclosed embodiments, upon receiving an original transmission, the receiver computes soft-bits (soft-decoding metrics, e.g., LLRs) for the bits of the original transmission and buffers (stores temporarily) the soft-bits in a HARQ buffer. If decoding of the original transmission fails, the receiver requests, and subsequently receives, a retransmission from the transmitter. As noted above, the retransmission uses a lower MCS, i.e., an MCS having better error performance than the MCS used in the original transmission.

The receiver computes soft-bits for the bits of the retransmission, and combines the (newly-computed) soft-bits of the retransmission with the corresponding soft-bits of the original transmission (buffered in the HARQ buffer). The receiver then reattempts to reconstruct the data carried by the transmission by applying FEC decoding to the combined soft-bits.

Several implementation examples of the disclosed techniques are described in detail below. In some embodiments, e.g., when the FEC code is a Binary Convolutional Code (BCC), lowering the MCS in the retransmission comprises choosing a lower modulation order and/or lower coding rate. In other embodiments, e.g., when the FEC code is a Low-Density Parity Check (LDPC) code, lowering the MCS in the retransmission is performed by choosing a lower modulation order but retaining the same coding rate.

When using the disclosed technique, each combined soft-bit is computed from a soft-bit transmitted using the MCS of the original transmission, and a soft-bit transmitted using the (lower-order) MCS of the retransmission. Since the combined soft-bits are based, in part, on the lower-order MCS of the retransmission, the receiver has a high likelihood of decoding the FEC code successfully, even if the MCS selection for the original transmission was inaccurate.

Moreover, due to the difference in MCS between the original transmission and the retransmission, a certain bit in the retransmission is likely to be transmitted on a different sub-carrier (and thus in a different frequency sub-band) than the corresponding bit in the original transmission. This feature further increases the robustness of the disclosed technique, and obviates the need for additional diversity measures.

FIG. 1 is a block diagram that schematically illustrates a WLAN communication system 20, in accordance with an embodiment that is described herein. System 20 comprises an AP 24 and an STA 28. In an embodiment, although not necessarily, AP 24 and STA 28 operate in accordance with one of the IEEE 802.11 standards, e.g., 802.11ac or 802.11ax. The figure shows a single AP 24 and a single STA 28, for clarity. Real-life systems, however, typically comprise multiple STAs 28 and may comprise multiple APs 24.

In the present example, AP 24 comprises an AP processor 32, an AP transmitter (TX) 36, and one or more AP antennas 40. AP processor 32 is configured to carry out the various processing tasks of the AP, e.g., various Medium Access Control (MAC) and physical-layer (PHY) processing tasks.

Among other tasks, AP processor 32 is configured to generate original WLAN transmissions that convey data intended to STA 28, and generate retransmissions in response to acknowledgements (ACKs) and/or negative acknowledgements (NACKs) received from STA 28. As will be explained in detail below, in some embodiments AP processor 32 generates a retransmission with a lower MCS than the corresponding original transmission. AP transmitter 36 is configured to transmit WLAN signals that carry the original transmissions and retransmissions to STA 28 via antennas 40.

In the embodiment of FIG. 1, STA 28 comprises one or more STA antennas 44, an STA receiver (RX) 48, and a STA processor 52. STA receiver 48 is configured to receive, via antennas 44, WLAN signals that carry original transmissions and retransmissions from AP 24. STA processor 52 is configured to carry out the various processing tasks of the STA, e.g., various PHY and MAC processing tasks.

Among other functions, STA processor 52 is configured to apply soft-bit computation, soft-bit combining and FEC decoding to the data of received original transmissions and retransmissions. As explained below, in some embodiments STA processor 52 receives and processes an original transmission and a corresponding retransmission, wherein the retransmission has a lower MCS than the original transmission. STA processor 52 is also configured to generate ACKS and/or NACKs for requesting retransmissions from AP 24.

The description above focuses on HARQ in forward-channel communication, i.e., transfer of data from AP 24 to STA 28, for the sake of clarity. Typically, however, AP 24 and STA 28 and their components are also configured to communicate over the reverse channel, i.e., to transfer data from STA 28 to AP 24. The disclosed HARQ techniques are also applicable to reverse-channel communication, as well as to sidelink communication between STAs (not seen in the figure). The focus on the forward channel is made by way of example only, for the sake of clarity. APs and STAs are collectively referred to herein as WLAN devices.

Figure 2:
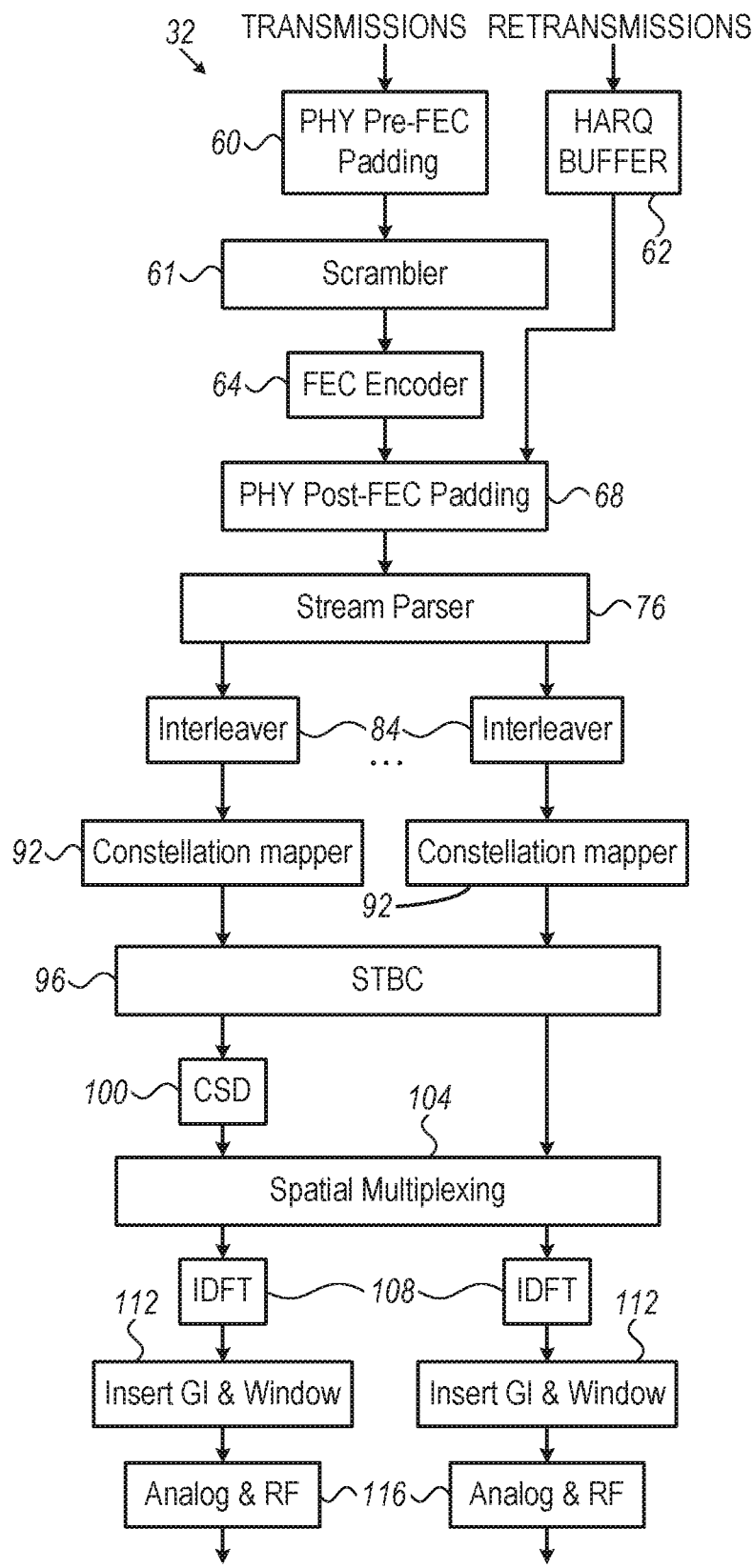
FIG. 2 is a block diagram that schematically illustrates transmit-side physical-layer (PHY) circuitry of a WLAN device in the system of FIG. 1, in accordance with an embodiment that is described herein.

FIG. 2 is a block diagram that schematically illustrates transmit-side physical-layer (PHY) circuitry of a WLAN device (in the present example elements of AP processor 32) in accordance with an embodiment that is described herein. In the embodiment of FIG. 2, AP processor 32 comprises a cascade or pipeline of the following blocks:

A pre-FEC padding block 60 is configured to pad the input data of original transmissions in preparation for FEC encoding.

A scrambler 61 is configured to scramble the padded data by bit-wise multiplication with a scrambling sequence.

A FEC encoder 64 is configured to encode the data with a FEC. In some embodiments the FEC code comprises a Binary Convolutional Code (BCC). In other embodiments the FEC code comprises a Low-Density Parity Check (LDPC) code. Alternatively, any other suitable type of FEC can be used.

A HARQ buffer 62 is configured to store the encoded bits of original transmissions (taken from the output of FEC encoder 64). Corresponding retransmissions obtain the encoded bits directly from HARQ buffer 62 instead of encoding the same data again.

A post-FEC padding block 68 is configured to pad the encoded data produced by FEC encoder 64 and HARQ buffer 62.

A stream parser 76 is configured to separate the coded bits into spatial streams.

Interleavers 84 (typically one per spatial stream) are configured to interleave the data within each stream. Each interleaver 84 receives the bits of a respective spatial stream, and outputs the bits of the spatial stream in a modified order. In the present example only two interleavers are depicted, for the sake of clarity.

Constellation mappers 92 (typically one per spatial stream) are configured to map the data onto constellation symbols, i.e., to modulate the data. Only two mappers are depicted in the present example, for clarity.

A Space-Time Block Coding (STBC) encoder 96 is configured to apply STBC coding—a transmit-diversity scheme that transmits data redundantly over multiple different spatial streams.

A Cyclic Shift Diversity (CSD) block 100 is configured to achieve transmit diversity by applying delay-shifts or phase-shifts between spatial streams.

A spatial multiplexing block 104 is configured to apply spatial multiplexing to the spatial streams, e.g., beamforming that steers one or more directional transmission beam in the direction of the intended receiver or receivers.

Inverse Discrete Fourier Transform (IDFT) blocks 108 (typically one per antenna 40) are configured to transform the spatially-multiplexed signal to the time domain by applying an IDFT to vectors of signal samples.

Windowing blocks 112 (typically one per antenna 40) are configured to add a Guard Interval (GI) following each symbol to be transmitted, and then apply a window filter for spectral shaping of the signal to match a desired spectral mask.

Analog & RF blocks 116 (typically one per antenna 40) are configured to convert the signal into an analog Radio Frequency (RF) signal, for transmission by antennas 40.

In a typical flow, the above-described pipeline receives new data (e.g., packets or frames) for transmission (original transmissions) and indications of data (e.g., packets or frames) that needs to be retransmitted. The data of original transmissions undergoes FEC encoding in encoder 64, and the encoded bits are stored in HARQ buffer 62. If certain data has to be retransmitted, the encoded bits of this data are retrieved from HARQ buffer 62, which buffers encoded bits that had been initially transmitted, without a need to re-encode the same data again.

Figure 3:
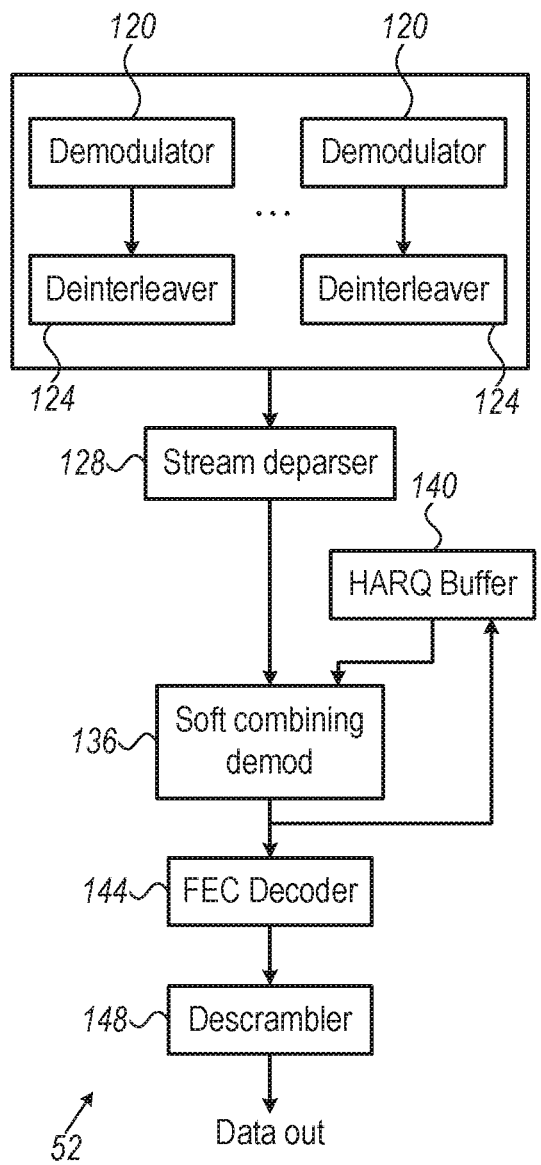
FIG. 3 is a block diagram that schematically illustrates receive-side PHY circuitry of a WLAN device in the system of FIG. 1, in accordance with an embodiment that is described herein.

FIG. 3 is a block diagram that schematically illustrates receive-side PHY circuitry of a WLAN device (in the present example elements of STA processor 52), in accordance with an embodiment that is described herein. In the embodiment of FIG. 3, STA processor 52 comprises a cascade of the following blocks:

Multiple demodulators 120 (typically one per spatial stream) are configured to demodulate the received spatial streams, and compute soft-bits (soft-decoding metrics) for the received data (original transmissions and/or retransmissions). In the present example only two demodulators are seen in the figure, for the sake of clarity.

Multiple de-interleavers 124 (typically one per spatial stream) are configured to de-interleave the demodulated soft-bits of the received spatial streams. In the present example only two de-interleavers are seen in the figure, for the sake of clarity.

A stream de-parser 128 is configured to de-parse the spatial streams, so as to produce a single composite stream of soft-bits.

A soft combining demodulator 136 is configured to combine soft-bits of corresponding bits of original transmissions and corresponding retransmissions, so as to produce combined soft-bits. Any suitable type of soft-bits, for example Log-Likelihood Ratios (LLRs), can be used.

A HARQ buffer 140 is used for temporary storage of soft-bits for the purpose of combining by demodulator 136. For example, upon receiving an original transmission, demodulator 136 stores the soft-bits computed for the bits of the transmission in buffer 140. Upon receiving a corresponding retransmission, demodulator 136 combines the soft-bits of the bits in the original transmission (stored in HARQ buffer 140) with newly-computed soft-bits of corresponding bits in the retransmission, and stores the combined soft-bits in the HARQ buffer. As noted above, if the combined soft-bits are still insufficient for successful decoding, an additional retransmission may be requested using the same HARQ process.

A FEC decoder 144 is configured to decode the FEC applied by encoder 64. As noted above, the FEC code may comprise a BCC, an LDPC code, or any other suitable FEC code.

A de-scrambler 148 is configured to de-scramble the soft-bits stream, by bit-wise multiplication with the scrambling sequence used by scrambler 61.

The configurations of system 20, AP 24 and STA 28 of FIG. 1, and their components, such as the elements of AP processor 32 shown in FIG. 2 and the elements of STA processor 52 shown in FIG. 3, are depicted solely by way of example. In alternative embodiments, any other suitable configurations can be used. For example, in the example configuration of FIGS. 2 and 3 scrambler 61 precedes FEC encoder 64 in the transmit-side PHY circuitry (FIG. 2), and descrambler 148 is located after FEC decoder 144 in the receive-side PHY circuitry (FIG. 3). In alternative embodiments, scrambling and descrambling can be performed at other suitable stages of the transmit-side and receive-side PHY processing, respectively. Example configurations in which FEC encoding is performed before scrambling, and descrambling is performed before FEC decoding, are disclosed in U.S. patent application Ser. No. 16/583,295, filed Sep. 26, 2019, which is assigned to the assignee of the present patent application and whose disclosure is incorporated herein by reference.

The various elements of AP 24 and STA 28 may be implemented using dedicated hardware or firmware, such as hard-wired or programmable components, e.g., in one or more Application-Specific Integrated Circuits (ASICs), Field-Programmable Gate Arrays (FPGAs) or RF Integrated Circuits (RFICs), using software, or using a combination of hardware and software elements.

In some embodiments, certain elements of AP 24 and/or STAs 28, e.g., certain functions of AP processor 32 and/or STA processor 52, are implemented in one or more programmable processors, which are programmed in software or firmware to carry out the functions described herein. The software may be downloaded to the one or more processors in electronic form, over a network, for example, or it may, alternatively or additionally, be provided and/or stored on non-transitory tangible media, such as magnetic, optical, or electronic memory.

Figure 4:
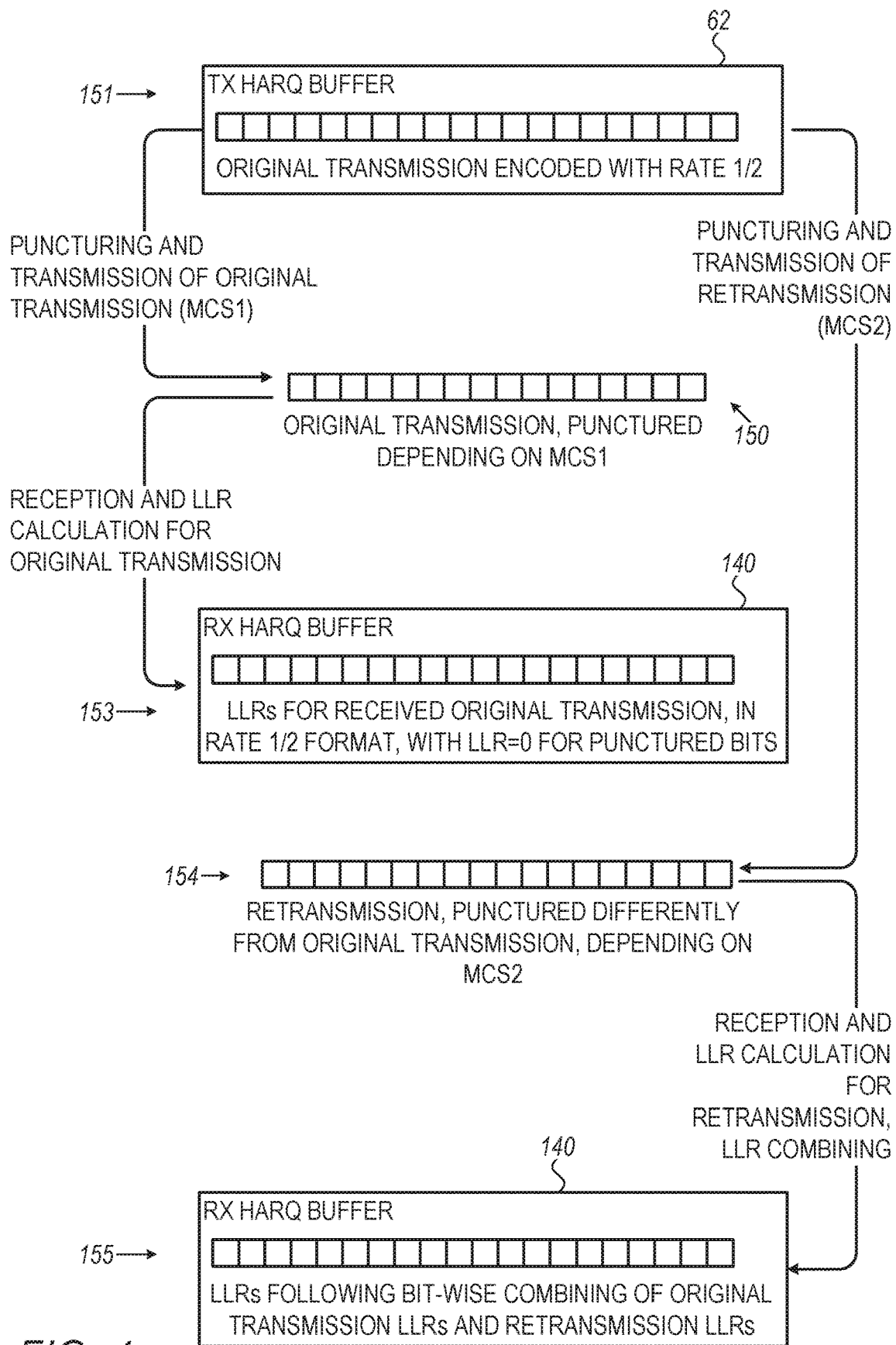
FIG. 4 is a diagram that schematically illustrates a process of combining soft-decoding metrics of a received original transmission and a received retransmission having different Modulation and Coding Schemes (MCSs), in accordance with an embodiment that is described herein.

FIG. 4 is a diagram that schematically illustrates a process of combining soft-decoding metrics of a received original transmission and a received retransmission having different MCSs, in accordance with an embodiment that is described herein. In this embodiment, the FEC code comprises a BCC. The lowest (most robust) coding rate being used is ½. When using this code rate, the data of a given transmission (e.g., packet or frame) comprises a rate-½ code word.

All other (higher) coding rates used in the various MCSs are implemented by puncturing, i.e., by transmitting a selected subset of the bits of the rate-½ code word. For a given coding rate (e.g., ⅔, ¾ or ⅚), the bits of the rate-½ code word that are transmitted are referred to herein as "transmitted bits," and the bits of the rate-½ code word that are not transmitted are referred to herein as "punctured bits." As noted above, the MCSs may also differ from one another in the modulation order (number of bits per symbol).

In an embodiment, when generating an original transmission in AP processor 32, FEC encoder 64 encodes the data with a coding rate of ½, regardless of the actual MCS that is chosen for the original transmission. FEC encoder 64 stores the resulting rate-½ code word in HARQ buffer 62. The top of FIG. 4 (the buffer at this stage is marked 151 in the figure) shows a rate-½ code word buffered in HARQ buffer 62. To avoid confusion, HARQ buffer 62 of AP 24 is denoted "TX HARQ BUFFER" in the figure, and HARQ buffer 140 of STA 28 is denoted "RX HARQ BUFFER."

When transmitting the original transmission, AP processor 32 reads the appropriate bits from TX HARQ buffer 62 depending on the chosen MCS (all the bits if the MCS specifies rate ½, or a selected subset of punctured bits if the MCS specifies a lower coding rate). The MCS chosen for the original transmission is denoted MCS1 in the figure. The bits read from TX HARQ buffer 62 are provided to post-FEC padding block 68 for subsequent processing. In the example of FIG. 4, MCS1 specifies a coding rate that is higher than ½, and therefore puncturing is performed. The original transmission, punctured to achieve the coding rate of MCS1, is denoted 150 in the figure.

When original transmission 150 is received at STA 28, STA processor 52 computes soft-bits for the received bits of the original transmission. In the present example the soft-bits comprise LLRs. STA processor 52 stores the LLRs in RX HARQ buffer 140. Since MCS1 specifies a coding rate higher than ½, the received bits include only a subset of the bits of the rate-½ code word. Correspondingly, fewer LLRs are computed.

Nevertheless, in an embodiment, STA processor 52 stores the LLRs in RX HARQ buffer 140 according to the original bit positions in the rate-½ code word. For the punctured bits (for which no bits are actually received and no LLRs are computed), STA processor 52 sets the corresponding values in RX HARQ buffer 140 to zero.

In other words, the total buffer space used for buffering the LLRs of the original transmission in RX HARQ buffer 140 corresponds to the original size of the rate-½ code word, regardless of the actual coding rate of MCS1. For the transmitted bits, the HARQ buffer holds the values of the computed LLRs. For any punctured bit, the HARQ buffer holds a value of zero. The configuration of RX HARQ buffer 140 at this stage is shown in the middle of FIG. 4 (marked 153).

At a later time, AP processor 32 is required to transmit a retransmission using some lower-order MCS denoted MCS2. MCS2 has a lower coding rate than MCS1. When generating the retransmission, AP processor 32 reads the appropriate subset of bits of the rate ½ code word from HARQ buffer 62 (the subset of bits corresponding to the coding rate of MCS2). The bits are provided to post-FEC padding block 68 for subsequent processing. In this manner, no additional FEC encoding is needed for generating the retransmission, even when switching to a different MCS. The retransmission, punctured to achieve the coding rate of MCS2, is denoted 154 in the figure.

When retransmission 154 is received at STA 28, STA processor 52 computes LLRs for the received bits of the retransmission. STA processor 52 then combines every (newly-computed) LLR of the retransmission with the corresponding LLR of the original transmission (buffered in RX HARQ buffer 140). STA processor 52 stores the resulting combined LLR in-place in RX HARQ buffer 140, i.e., at the same location in the buffer as the corresponding LLR of the original transmission.

This process is carried out for both transmitted bits and punctured bits. If, for a certain LLR of the retransmission, the corresponding LLR in RX HARQ buffer 140 is equal to zero (because this bit was punctured in the original transmission), the combined LLR will be equal to the LLR of the retransmission. (As explained above, by storing zero values in place of punctured bits, STA processor 52 retains in RX HARQ buffer 140 spaces for the LLRs of the retransmission bits that do not have corresponding bits in the original transmission.)

The configuration of RX HARQ buffer 140 at this stage (marked 155) is shown at the very bottom of FIG. 4. STA processor 52 (more specifically, FEC decoder 144) then reattempts to reconstruct the data by applying FEC decoding to the combined LLRs in RX HARQ buffer 140. The FEC decoding in this case is performed according to the coding rate of MCS2.

The process shown in FIG. 4 is an example process that is depicted solely for the sake of clarity. In alternative embodiments, any other suitable process can be used. For example, in an alternative embodiment, when transmitting a retransmission, AP processor 32 does not transmit all the bits of the BCC code word, but only the bits that were punctured and not transmitted in the original transmission. In other words, AP processor 32 transmits only the bits that were added to the BCC code word due to switching to a lower MCS. In these embodiments, LLR combining amounts to replacing the zero values in RX HARQ buffer 140 with the LLRs computed for the received bits of the retransmission.

The above description referred mainly to BCC. In alternative embodiments, the FEC code comprises an LDPC code. In an example embodiment, when using LDPC, all the MCSs use the same coding rate, and differ from one another only in the modulation order. The use of a single coding rate simplifies the implementation of the AP processor and STA processor significantly.

Figure 5:
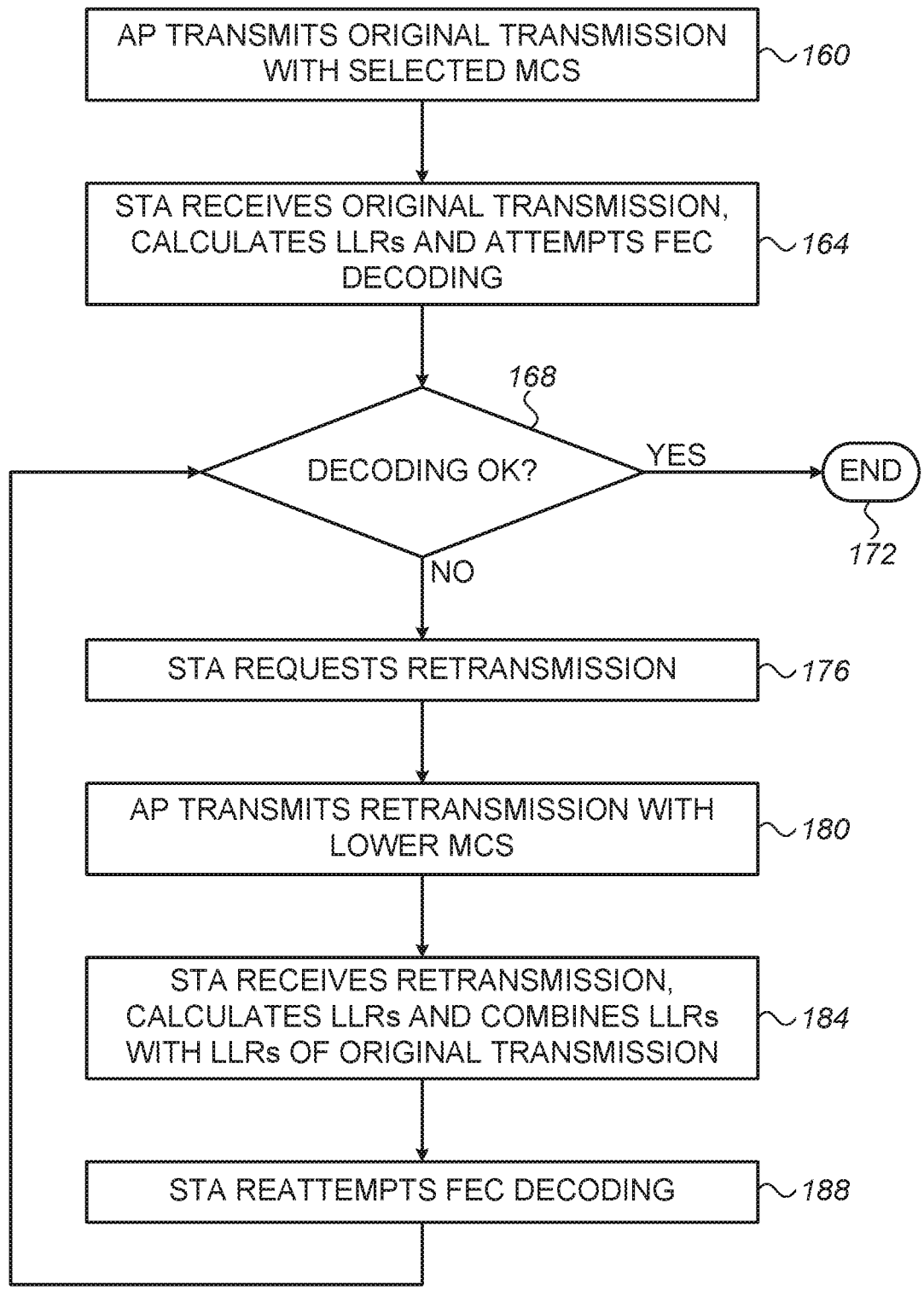
FIG. 5 is a flow chart that schematically illustrates a method for HARQ using transmissions and retransmissions having different MCSs, in accordance with an embodiment that is described herein.

FIG. 5 is a flow chart that schematically illustrates a method for HARQ using transmissions and retransmissions having different MCSs, in accordance with an embodiment that is described herein. The method begins at an original transmission operation 160, with AP processor 32 in AP 24 generating an original transmission, and AP TX 36 transmitting the original transmission to STA 28. The original transmission is generated using a certain selected MCS. At an original reception operation 164, STA RX 48 of STA 28 receives the original transmission. STA processor 52 computes LLRs for the bits of the received transmission, and attempts to decode the FEC code based on the LLRs.

At a checking operation 168, STA processor 52 checks whether FEC decoding succeeded or failed. If FEC decoding was successfully, STA processor 52 provides the decoded data for further processing, and the method terminates. Otherwise, if FEC decoding has failed, STA processor 52 requests a retransmission from AP 24, at a retransmission requesting operation 176. At a retransmission operation 180, AP processor 32 generates a retransmission using a lower-order MCS than the MCS used in the original transmission. AP TX 36 transmits the retransmission to STA 28.

At a retransmission reception operation 184, STA RX 48 of STA 28 receives the retransmission. STA processor 52 computes LLRs for the bits of the received retransmission, and combines the LLRs of the retransmission with the corresponding LLRs of the original transmission that are buffered in HARQ buffer 140. STA processor 52 combines the LLRs notwithstanding the difference in MCS between the original transmission and the retransmission, e.g., using the technique of FIG. 4 above. STA processor 52 reattempts to decode the FEC code using the combined LLRs. The method then loops back to checking operation 168 above, for checking whether FEC decoding was successful, and possibly requesting an additional retransmission.

The process shown in FIG. 5 is an example process that is depicted solely for the sake of clarity. In alternative embodiments, any other suitable process can be used. For example, in an embodiment, when combining LLRs, STA processor 52 assigns higher weights to the LLRs of the retransmission than the weights assigned to the LLRs of the transmission, because the retransmission uses a more robust MCS. In this embodiment STA processor 52 produces the combined LLRs by combining the weighted LLRs of the retransmission and the differently-weighted LLRs of the original transmission.

In some embodiments, AP 24 transmits the original transmissions and the retransmissions using Orthogonal Frequency-Domain Multiplexing (OFDM). In these embodiments, AP processor 32 generates a sequence of OFDM symbols, each OFDM symbol comprising multiple sub-carriers having respective sub-carrier frequencies. The data of the transmission or retransmission is modulated onto the sub-carriers. Due to the difference in MCS between an original transmission and a corresponding retransmission, a certain bit in the retransmission is likely to be transmitted (and received by the receiver) on a different sub-carrier (and thus in a different frequency sub-band) than the corresponding bit in the original transmission. This feature introduces frequency diversity that further increases the robustness of the disclosed technique.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for receiving a Wireless Local-Area Network (WLAN) data transmission, the method comprising:
   receiving, at a first WLAN device from a remote WLAN device, a WLAN transmission comprising first bits that are modulated and encoded using a first Modulation and Coding Scheme (MCS) associated with a first modulation scheme and a first coding rate of a Forward Error Correction (FEC) code, the first bits being a first subset of bits of a code word of the FEC code;
   computing first soft-decoding metrics for the first bits;
   buffering the first soft-decoding metrics in a memory buffer, in memory locations that correspond to respective bit positions of the bits of the code word, thereby retaining in the memory buffer spaces at the memory locations that correspond to bit positions outside the first subset;
   receiving, from the remote WLAN device, a WLAN retransmission corresponding to the WLAN transmission, the WLAN retransmission comprising second bits that are modulated and encoded using a second MCS associated with a second modulation scheme and a second FEC coding rate of the FEC code, the second bits being a second subset of the bits of the code word of the FEC code, the second subset containing the first subset, the second MCS having better error performance than the first MCS;
   computing second soft-decoding metrics for the second bits;
   for one or more second bits that correspond to respective ones of the first bits, combining the first soft-decoding metrics and the corresponding second soft-decoding metrics, to produce combined soft-decoding metrics, and buffering the combined soft-decoding metrics in the memory buffer in place of the corresponding first soft-decoding metrics;
   for one or more second bits that do not correspond to any of the first bits, buffering the respective second soft-decoding metrics in the spaces retained in the memory buffer; and
   reconstructing data carried by the WLAN transmission by applying FEC decoding to the buffered soft-decoding metrics.

2. The method according to claim 1, further comprising sending from the first WLAN device to the remote WLAN device an indication that the data carried by the WLAN transmission, having the first MCS, was not reconstructed successfully, and receiving the WLAN retransmission, having the second MCS, in response to the indication.

3. The method according to claim 1, wherein combining the first soft-decoding metrics and the second soft-decoding metrics comprises assigning first weights to the first soft-decoding metrics, assigning second weights, higher than the first weights, to the second soft-decoding metrics, and combining the weighted first soft-decoding metrics and the weighted second soft-decoding metrics.

4. The method according to claim 1, wherein receiving the WLAN transmission comprises receiving a first bit on a first sub-carrier frequency, and wherein receiving the WLAN retransmission comprises receiving a second bit, corresponding to the first bit, on a second sub-carrier frequency that is different from the first sub-carrier frequency.

5. A Wireless Local-Area Network (WLAN) device, comprising:
   a receiver, configured to:
      receive, from a remote WLAN device, a WLAN transmission comprising first bits that are modulated and encoded using a first Modulation and Coding Scheme (MCS) associated with a first modulation scheme and a first coding rate of a Forward Error Correction (FEC) code, the first bits being a first subset of bits of a code word of the FEC code; and
      subsequently receive, from the remote WLAN device, a WLAN retransmission corresponding to the WLAN transmission, the WLAN retransmission comprising second bits that are modulated and encoded using a second MCS associated with a second modulation scheme and a second coding rate of the FEC code, the second bits being a second subset of the bits of the code word of the FEC code, the second subset containing the first subset, the second MCS having better error performance than the first MCS; and a processor, configured to:
  compute first soft-decoding metrics for the first bits;
  compute second soft-decoding metrics for the second bits;
  for one or more second bits that correspond to respective ones of the first bits, combine the first soft-decoding metrics and the corresponding second soft-decoding metrics, to produce combined soft-decoding metrics, and buffering the combined soft-decoding metrics in the memory buffer in place of the corresponding first soft-decoding metrics;
  for one or more second bits that do not correspond to any of the first bits, buffering the respective second soft-decoding metrics in the spaces retained in the memory buffer; and
  reconstruct data carried by the WLAN transmission by applying FEC decoding to the buffered soft-decoding metrics.

6. The WLAN device according to claim 5, wherein the processor is configured to send to the remote WLAN device an indication that the data carried by the WLAN transmission, having the first MCS, was not reconstructed successfully, and to receive the WLAN retransmission, having the second MCS, in response to the indication.

7. The WLAN device according to claim 5, wherein the processor is configured to assign first weights to the first soft-decoding metrics, to assign second weights, higher than the first weights, to the second soft-decoding metrics, and to combine the weighted first soft-decoding metrics and the weighted second soft-decoding metrics.

8. The WLAN device according to claim 5, wherein the receiver is configured to receive a first bit of the WLAN transmission on a first sub-carrier frequency, and to receive a second bit of the WLAN retransmission, corresponding to the first bit of the WLAN transmission, on a second sub-carrier frequency that is different from the first sub-carrier frequency.

* * * * *